United States Patent [19]

Beale et al.

[11] 3,745,425

[45] July 10, 1973

[54] SEMICONDUCTOR DEVICES

[75] Inventors: Julian Robert Anthony Beale, Reigate; Andrew Francis Beer, Pound Hill, Crawley, both of England; Thomas Klein, Palo Alto, Calif.; Nigel Malcolm St. John Murphy, Redhill, England

[73] Assignee: U.S. Philips Corporation, New York, N.Y.

[22] Filed: June 17, 1966

[21] Appl. No.: 558,427

[30] Foreign Application Priority Data

June 18, 1965 England .......................... 25,874/65

[52] U.S. Cl. ......... 317/235 R, 148/175, 317/235 B, 317/235 AM

[51] Int. Cl. ........................................... H01l 11/14

[58] Field of Search .................. 317/235 B, 235 AM

[56] References Cited

UNITED STATES PATENTS

| | | | |
|---|---|---|---|
| 3,315,096 | 4/1967 | Carlson et al. | 317/235 X |
| 3,411,199 | 11/1968 | Heiman et al. | 317/235 X |
| 3,417,464 | 12/1968 | Fang et al. | 317/235 X |
| 3,283,221 | 11/1966 | Heiman | 317/235 |
| 3,305,708 | 2/1967 | Ditrick | 317/234 |
| 3,336,661 | 8/1967 | Polinsky | 29/589 |

*Primary Examiner*—John W. Huckert
*Assistant Examiner*—William D. Larkins
*Attorney*—Frank R. Trifari

[57] ABSTRACT

An insulated gate field effect device comprising opposite conductivity type source and drain electrodes in a one-type substrate, forming source and drain P-N junctions. The drain P-N junction is back-biased forming a depletion layer extending into the substrate. To diminish the width of the depletion layer, an additional zone of the same conductivity type as the drain but of higher resistivity is provided contiguous with the drain offering the advantages of low capacitance and low depletion layer width as a function of voltage.

4 Claims, 18 Drawing Figures

INVENTORS
JULIAN R. A. BEALE
ANDREW F. BEER
THOMAS KLEIN
NIGEL M. ST.J. MURPHY
BY Frank R. Trifari
AGENT INVENTORS
JULIAN R. A. BEALE
ANDREW F. BEER
THOMAS KLEIN
NIGEL M. ST. J. MURPHY
BY [signature]
AGENT INVENTORS
JULIAN R.A. BEALE
ANDREW F. BEER
THOMAS KLEIN
NIGEL M. ST.J. MURPHY
BY Frank R. Trifari
AGENT INVENTORS
JULIAN R. A. BEALE
ANDREW F. BEER
THOMAS KLEIN
NIGEL M. ST. J. MURPHY
BY Frank R. Trifari
AGENT INVENTORS
JULIAN R. A. BEALE
ANDREW F. BEER
THOMAS KLEIN
NIGEL M. ST.J MURPHY
BY Frank R. Trifari
AGENT

SEMICONDUCTOR DEVICES

This invention relates to insulated gate field effect devices.

In the Proceedings of the Institute of Electrical and Electronic Engineers 1963 at page 1,190 et seq., S.R. Hofstein and F. P. Heiman described a semiconductor device in which current flow in the surface of a semiconductor body is controlled by the voltage applied to an insulated gate electrode on the surface. The basic structure of such a device consists of a monocrystalline semiconductor body of high bulk resistivity of one conductivity type having two low resistivity surface regions of the other conductivity type spaced apart in the body and forming two rectifying junctions with the bulk region of the body. A conductive layer is formed on a dielectric layer on the surface of the body, with the conductive layer extending between the two surface regions. Ohmic contacts are made to the two low resistivity surface regions and the conductive layer. The dielectric layer may be produced by oxidation of the semiconductor body.

A voltage applied between the two surface regions biases one junction in the forward direction and the other junction in the reverse direction; the two surface regions are termed the source and drain regions, analogously to a junction type field effect device. Current flow between the two surface regions may be initiated and controlled by the voltage applied between the conductive layer, which is termed the gate electrode, and the source region. The voltage applied to the gate electrode is of such polarity that a surface channel of the other conductivity type is induced between the two surface regions under the dielectric layer and current flow occurs between the two surface regions through the induced surface channel. This mode of operation is said to be the enhancement mode because the current carrying surface channel is formed by application of a voltage to the gate.

An insulated gate field effect transistor may be prepared which operates in the depletion mode; in this mode a current carrying channel is present at zero gate voltage and the concentration of charge carriers in the channel is decreased by application of a gate voltage of appropriate polarity. Such a device can also be operated in the enhancement mode by increasing the concentration of charge carriers. In the depletion mode the device is comparable to a junction field effect transistor in which the conductance of a current carrying channel is reduced by the depletion layer of a reverse biassed PN junction. An insulated gate field effect transistor may be operated as a vacuum tube analogue with a modulating signal applied to the gate which has a high input impedance.

In operation the drain electrode is reversed biassed and the depletion layer extends into the high resistivity substrate a greater distance than into the low resistivity drain region because of the lower concentration of charge carriers. The wide depletion layer around the drain region causes the device to have a low output capacitance, however the rate of change of depletion layer width ($a$) with source/drain voltage ($V_{DS}$) is high enough to cause the characteristics of the device to alter with the operating voltage to an undesirable extent for some applications. If a substrate of lower resistivity is used the rate of change ($da/dV_{DS}$) is reduced but the output capacitance is increased because of the narrower depletion layer. The minimum separation possible between the source and drain regions is limited by the variation in device characteristics with $V_{DS}$ and imposes on upper limit on the 'gm' obtainable with the device.

The invention provides a device in which a low output capacitance is obtained together with a relatively small rate of change ($da/dV_{DS}$). The invention also provides for the construction of a device in which a relatively close spacing of source and drain regions is obtained with a small rate of change ($da/dV_{DS}$).

In a semiconductor device according to the invention a monocrystalline high resistivity region of one conductivity type has two spaced surface regions of the other conductivity type and a layer of the one conductivity type extending from and contiguous with one surface region towards the other surface region and having a lower resistivity than the substrate, a dielectric layer on the surface of the substrate between the two surface regions, a conductive layer on the surface of the dielectric layer, and ohmic contacts to the surface regions and the conductive layer.

The layer of the one conductivity type may extend between the two surface regions and be contiguous with them. The layer of the one conductivity type may be situated between the substrate and the dielectric layer. The semiconductor material under the dielectric layer is required to have a resistivity such that an inversion layer can be obtained by application of a voltage to the gate electrode.

The other region may surround the surface region and separate it from the high resistivity region.

Four examples of the device according to the invention will now be described with reference to the accompanying diagrammatic drawings in which.

Figure 1A:
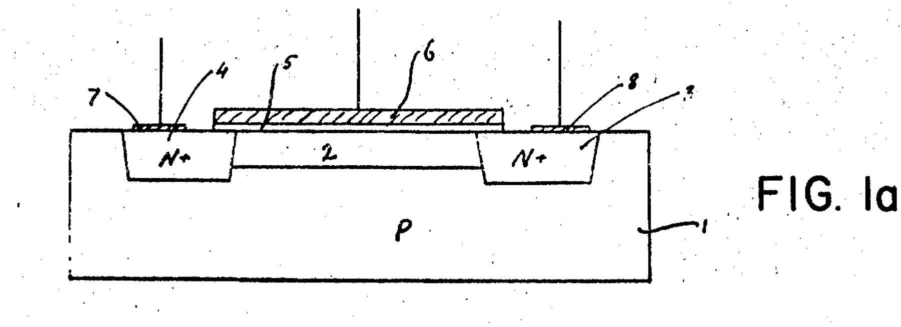
FIG. 1(*a–c*) shows vertical sections of devices according to the invention.
Figure 1B:
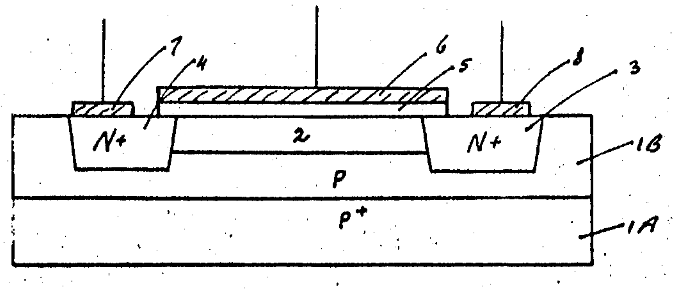
Figure 1C:
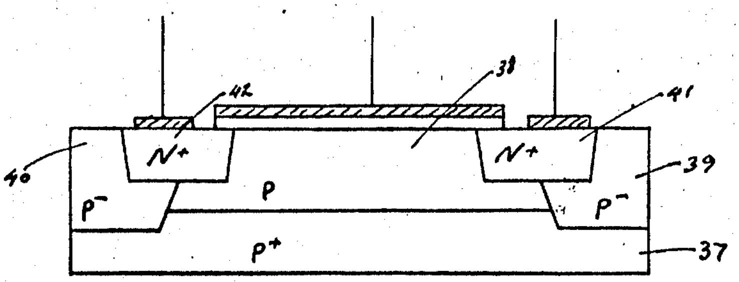
Figure 3A:
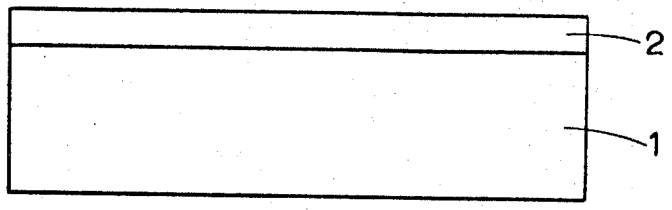
Figure 3B:
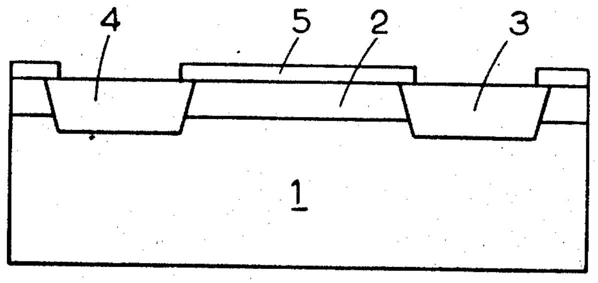
Figure 3C:
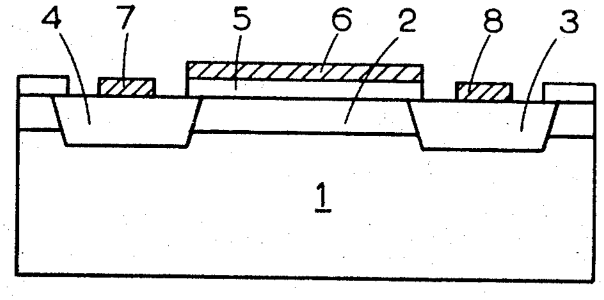
Figure 4:
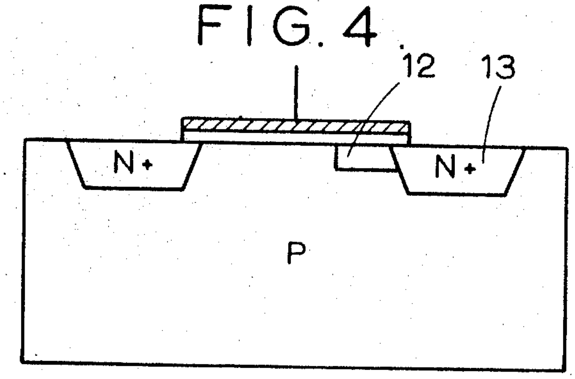
Figure 5:
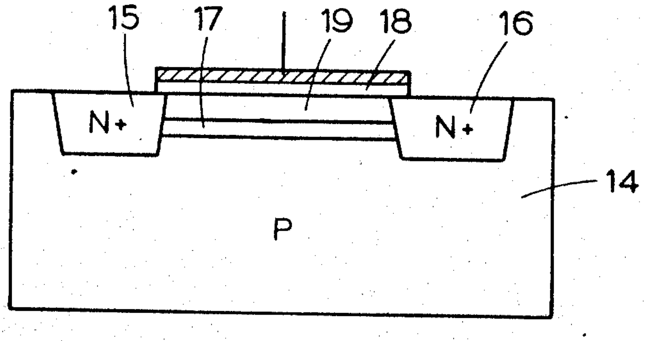
Figure 6:
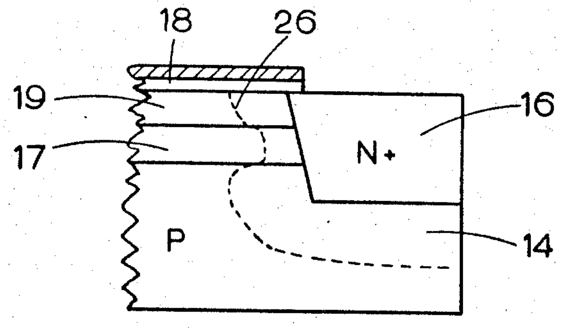
Figure 7A:
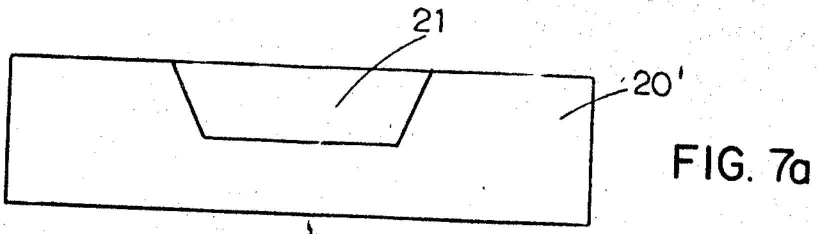
Figure 7B:
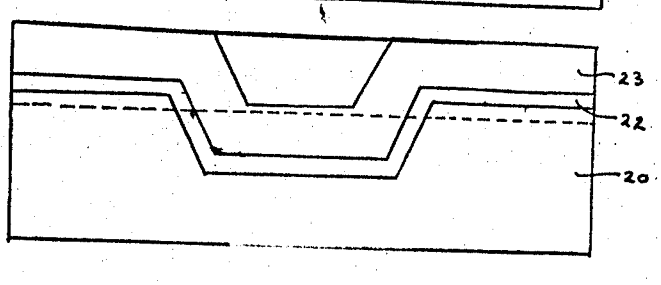
Figure 7C:
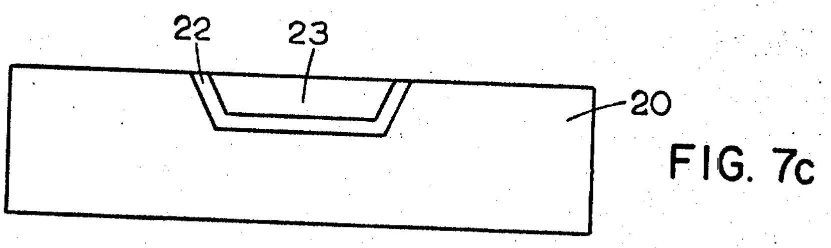
Figure 7D:
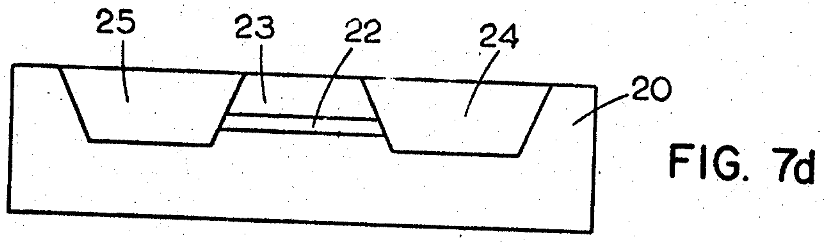
Figure 8A:
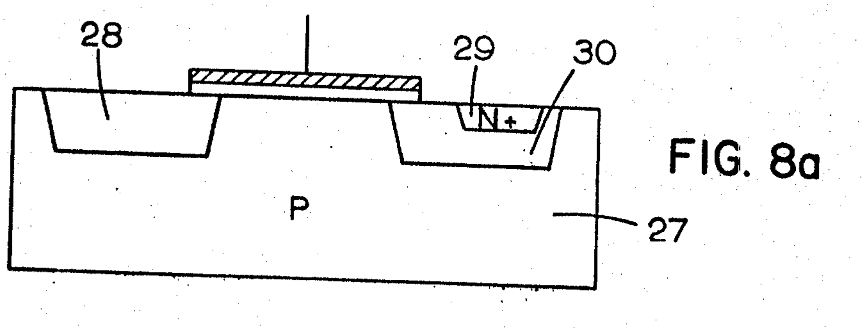
Figure 8B:
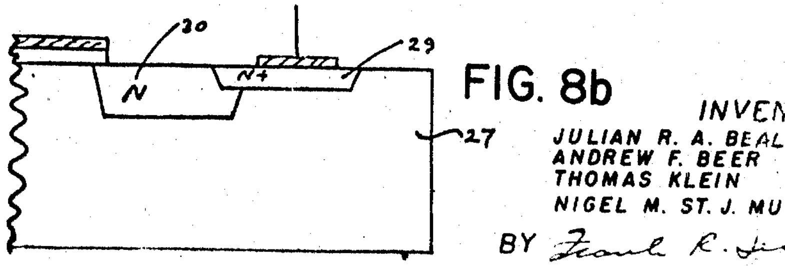
Figure 9A:
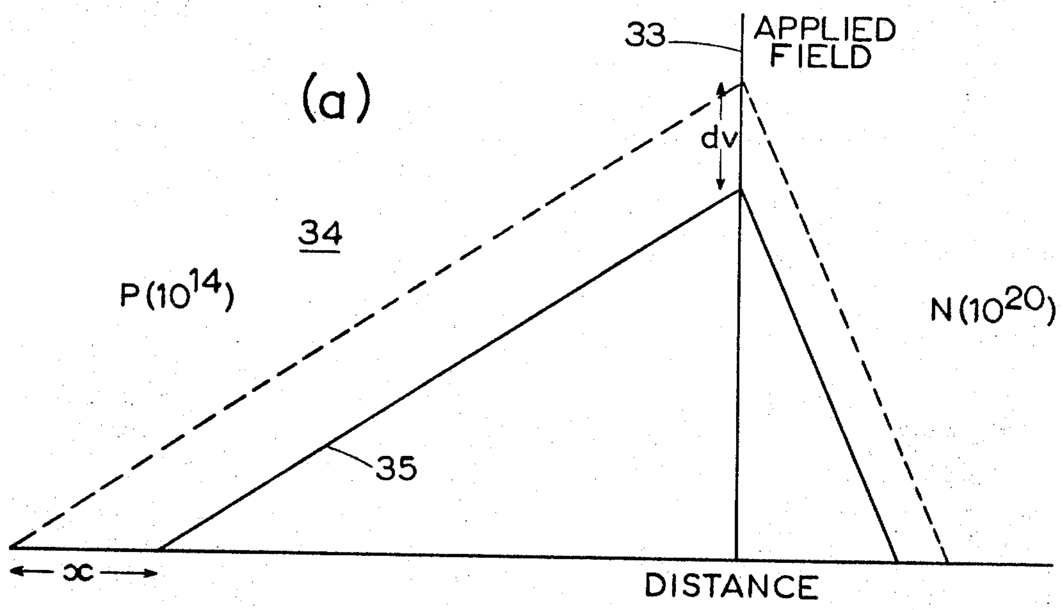
Figure 9B:
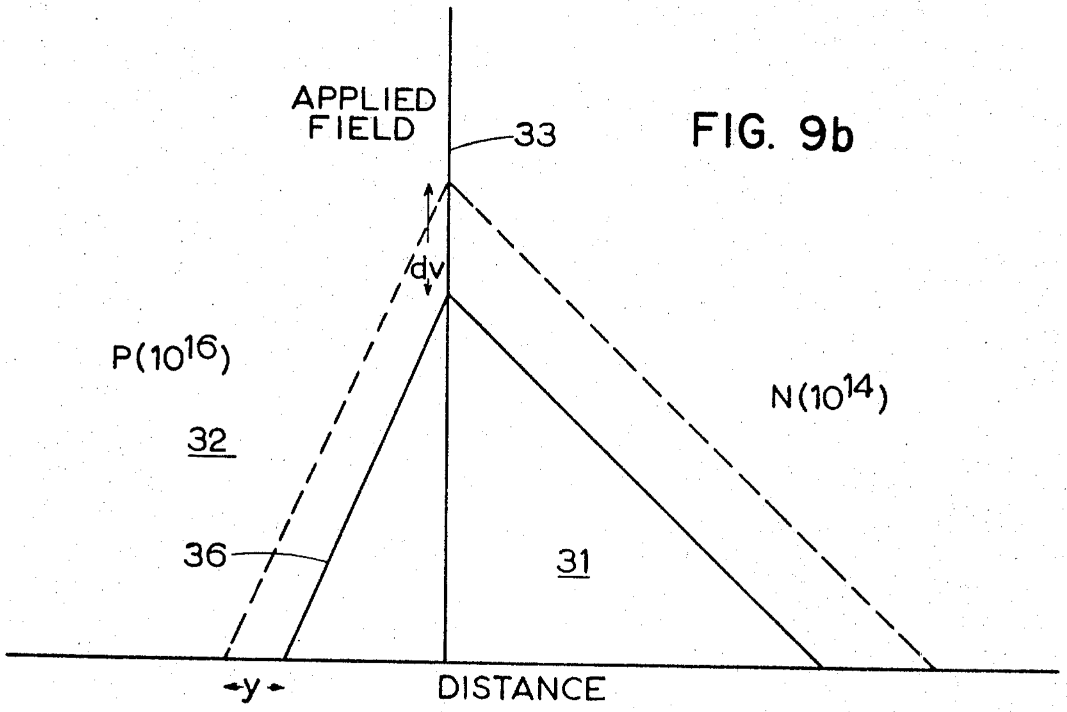

FIG. 3(*a–c*) shows stages in the manufacture of the device shown in FIG. 1 (*a*), FIG. 4 shows a vertical section of a device according to the invention, FIG. 5 shows a vertical section of a device according to the invention, FIG. 6 shows the mode of operation of the device shown in FIG. 5, FIG. 7(*a–d*) shows stages in the manufacture of the device shown in FIG. 5, FIG. 8*a* and FIG. 8*b* show vertical sections of devices according to the invention, FIG. 9(*a* and *b*) shows the mode of operation of the devices shown in FIG. 8.

In FIG. 1(*a*), high resistivity P-type substrate 1 of monocrystalline silicon contains boron at a concentration of approximately $10^{14}$ atoms. $cc.^{-1}$. Two N+ surface regions 3,4 containing phosphorus at a concentration of approximately $10^{20}$ atoms.$cc.^{-1}$ are contiguous with the substrate and a surface layer 2 of P-type material containing boron at a concentration of approximately $10^{16}$ is contiguous with the substrate 1 and the two regions 3,4. The depth of the two regions is approximately $3\mu$ and the surface layer 2 has a depth of approximately $2\mu$. In the device according to the invention it is preferred for the depth of the surface layer to be about two-thirds the depth of the surface regions. The distance between the N+ regions is $10\mu$ and the length of each region is 1mm. A dielectric layer 5 of silicon dioxide is formed on the surface of the layer 2 of a depth of 0.6$\mu$ and extending over the PN junctions between the N+ regions and the substrate. Ohmic contacts 7,8 are made to regions 3,4 by evaporating aluminum through a mask and a conductive layer 6 of aluminum is formed on the dielectric layer 5 in the same operation. Electrical connections are made to the ohmic contacts 7,8 and the conductive layer 6.

In FIG. 1(*b*) the substrate consists of a P+ region 1A having a P type layer 1B in which the device is formed. The spaced surface regions 3,4 do not extend into the P+ region and the depth of the layer 1B is approximately 7$\mu$ so that the regions 3,4 are spaced from the P+ region 1A by approximately 4$\mu$.

The region 1A has a boron concentration of $10^{17}$ atoms $cc^{-1}$ and the layer 1B a boron concentration of $5 \times 10^{14}$ atoms $cc^{-1}$.

In FIG. 1(*c*) the P region 38 in which the current carrying channel is formed extends beyond the N+ surface regions 41, 42 to and is contiguous with the P+ region 37. The P− region parts 39, 40 may be regarded as the remnant of the P type layer 1B of FIG. 1(*b*) as the P type layer 2 is moved down to extend to the P+ region 1A.

The boron concentrations, in atoms $cc^{-1}$, in the P type regions are:

| | |
|---|---|
| P type (38) | $10^{16}$ |
| P+type (37) | $10^{17}$ |
| P−type (39,40) | $5 \times 10^{14}$ |

Figure 2:
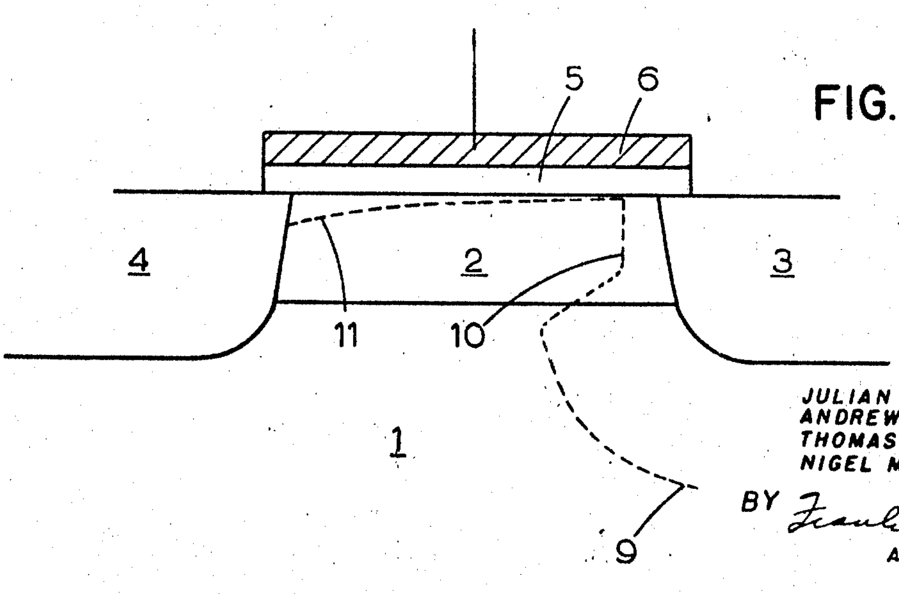
FIG. 2 shows the devices of FIGS. 1(*a*) and (*b*) in operation.

Referring now to FIG. 2, the drain region 3 has been made positive with respect to the source region 4, a positive voltage has been applied to the conductive layer or gate electrode 6 to form a N-type inversion layer in the surface layer 2. The inversion layer is delineated by the dashed line 11. The PN junction of the drain region is reverse biassed and the depletion layer extends into the substrate 1 to a position shown by the dashed line 9 and into the surface layer 2 to a position shown by the dashed line 10.

There is a further depletion layer under the inversion layer 11, but this is not shown for reasons of clarity. The extension of the depletion layer into the surface layer is less than the extension into the substrate because of the higher concentration of charge carriers in the surface layer. Current flows between the source and drain through the inversion layer and part of the depletion layer in the surface layer. The device has an output capacitance almost as low as a device without a surface layer due to the width of the depletion layer in the substrate but the rate of change ($da/dV_{DS}$) is relatively low because this parameter is determined by the doping in the depletion layer through which the current flows. The device may be used in the usual applications for insulated gate field effect transistors.

The region 1A of the device shown in FIG. 1(*b*) provides a low resistance path to the depletion layer surrounding the drain surface region and the current carrying channel; this reduces the power loss at high frequencies in the internal impedance between the drain surface region and the substrate.

The extension of the region of relatively low resistivity to contact the P+ region (as shown in FIG. 1(*c*)) provides a low resistance path for capacitive current between the current carrying channel and the P+ region and reduces the power loss at high frequencies.

Referring now to FIG. 3(*a*) a substrate 1 of high resistivity monocrystalline silicon containing boron at a concentration of $10^{14}$ atoms $cc.^{-1}$had a layer of silicon 2 epitaxially grown on one surface to a depth of 2$\mu$; this surface layer contained boron at a concentration of $10^{16}$ atoms $cc^{-1}$. This layer could alternatively be formed by the diffusion of boron into the substrate. A layer of silicon dioxide with a depth of 0.6$\mu$ was grown on the surface layer 2 by oxidation in wet nitrogen at 1,200°C for 30 minutes. Windows were then opened in the dioxide layer using conventional photolithographic techniques and phosphorus diffused through the windows to give two N+ surface regions 3,4 having a surface concentration of phosphorus of $10^{20}$ atoms. $cc.^{-1}$. The structure at this stage is shown in FIG. 3(*b*).

Aluminum was deposited to a depth of 0.3$\mu$ on the dioxide layer 5 and the two surface regions 7,8 through a mask. Electrical connections were made to the source and drain regions and the gate electrode 6.

The device in FIG. 4 is a modification of the device shown in FIG. 1 in that the P− type surface layer 12 only extends a certain distance from the drain surface region 13. The surface layer 12 extends 3$\mu$ from the drain surface region towards the source surface region. With a spacing of less than 10$\mu$ between the source and drain regions, the surface layer may extend less than 3$\mu$ from the drain surface region. The concentration of boron in the surface layer is $10^{16}$ atoms. $cc^{-1}$ and may be formed by diffusion through a masking oxide using photoresist techniques. In operation this device is similar to the device shown in FIG. 1, the depletion layer is narrower in the surface layer and the depletion layer has a contour similar to that of the depletion layer shown at 9, 10 in FIG. 2.

Referring to FIG. 5, a high resistivity substrate 14 has two N+ surface regions of low resistivity 15, 16 in one surface with a P− type layer 17 having a lower resistivity than the substrate and extending between the surface regions 15,16. Between the buried layer 17 and the dielectric 18 there is a thin P−type surface layer 19 of high resistivity material. The depth of the surface layer 19 is 1$\mu$ and the width of the buried layer 17 is 2$\mu$, the N+ surface regions are formed by diffusion to a depth of 4$\mu$. The device may be prepared by epitaxial techniques similar to those described for the device shown in FIG. 1.

In FIG. 7(*a*) a monocrystalline silicon body 20 of P−type conductivity and containing boron at a concentration of $10^{14}$ atoms. $cc^{-1}$ had a hole 21 formed in one surface by ultrasonic means. The hole had a depth of 5$\mu$ and a width of 15$\mu$. Using epitaxial techniques a layer 22 of P− type silicon with a concentration of boron of $10^{16}$atoms. $cc^{-1}$ and a layer 23 of P−type silicon with a concentration of boron of $10^{14}$atoms. $cc^{-1}$ were deposited on the monocrystalline substrate 20 to give the structure shown in FIG. 7(*b*). The epitaxial layers were then ground away down to the chain line in FIG. 7(*b*) using Alumina of≈0.5$\mu$ particle size to give the structure shown in 7(*c*). Phosphorus was then diffused into the surface of the silicon body using an oxide masking layer to form N−type diffused regions 24,25 which has a surface concentration of phosphorus of $10^{20}$ atoms.$cc^{-1}$.

In FIG. 6 the mode of operation of the device shown in FIG. 5 is illustrated. The junction between the drain region 16 and the P−type substrate 14, 17, 19 is reverse biassed but due to the relatively higher concentration of charge carriers in the buried layer 17 the depletion layer indicated by the dotted line 26 extends a shorter distance into this region than into the substrate because of the charges in the buried layer 17. The depletion layer at the surface between the surface layer 19 and the dielectric 18 is narrower than the depletion layer in the substrate 14 as shown in the Figure.

Referring to FIG. 8 a P–type substrate 27 having a boron concentration of $10^{16}$ atoms. $cc^{-1}$ regions 28, 29 on one surface, the region 29, intended as the drain region was formed in an N–type region 30 having a concentration of phosphorus of $10^{14}$atoms. $cc^{-1}$. The region 30 was formed by epitaxial deposition in an ultrasonically drilled hole in the substrate 27.

In operation, see FIG. 9, a greater volume 31 of the depletion layer exists in the N region, which has a charge carrier concentration less than that of the P region 32, than if a N+ drain region with a phosphorus concentration of $10^{20}$ atoms $cc^{-1}$ is used. The output capacitance of the device is dependant upon the width of the depletion layer enclosing the reverse biassed PN junction 33. As previously mentioned the width of the depletion layer is dependant on the applied field. With a high resistivity substrate 34, in 9(*a*) the distance *x* through which the edge of the depletion layer 35 moves for a change *d*V in the applied field is larger than the distance *y* through which the edges of the depletion layer 36 moves for the same change *d*V in the applied field. Thus the rate of change ($da/dV_{DS}$) is less for the configuration shown in FIG. 9(*b*) than for the configuration shown in FIG. 9(*a*).

Thus the characteristics of the device are made less dependant upon the voltage $V_{DS}$ applied to the device. The gate electrode in the device illustrated in FIG. 8 extends over the PN junction between the substrate 27 and the region 30, which has a width of 3$\mu$ between the region 29 and the substrate 27.

The region 30 may be formed only at the surface of the substrate 27 and extending between the surface region 29 and under the gate electrode. In this case the output capacitance would not be decreased to such an extent as when the region 30 surrounds the region 29 and separates this region from the substrate 27, as shown in FIG. 8(*a*) but a relatively low output conductance is still obtained.

The arrangement of the regions in this embodiment is shown in FIG. 8(*b*) in which the region 30 is seen to extend between the region 29 and the substrate 27 only at the surface of the substrate.

In FIG. 5 the buried layer 17 may only extend 3$\mu$ from the drain region 16. Although this embodiment may be difficult to prepare the effective section of the buried layer 17 is retained and in operation the device would have similar characteristics to the device illustrated in FIG. 5. The distance which the buried layer extends from the drain is not critical provided the depletion layer is always within the buried layer during operation.

The device according to the other aspect of the invention as shown in FIG. 8 may have a region extending from the drain region towards the source region as illustrated in FIGS. 1, 4 and 5. In this embodiment the substrate has an acceptor concentration of $10^{16}$ atoms. $cc^{-1}$ and a thin surface layer with a depth of 1$\mu$ has a concentration of $10^{14}$ atoms. $cc^{-1}$ and extends between the source and drain regions. The depletion layer in the thin surface layer is displaced in a manner similar to that shown for the depletion layer 26 in FIG. 6 due to the higher charge concentration in the substrate.

What we claim is:

1. An insulated gate field effect device comprising a semiconductive body including a substrate portion of one conductivity type material having a relatively high resistivity, at least two spaced surface zones of the opposite conductivity type in the body constituting source and drain electrodes and forming P-N junctions with the substrate portion, a dielectric layer on the surface of the body and covering a portion of the body between the surface zones of opposite conductivity type, a conductive layer on the surface of the dielectric layer, and ohmic connections to the conductive layer and to the two spaced surface zones for reverse biasing the P-N junction at the drain electrode, wherein the improvement comprises within the body contiguous with the surface zone constituting the drain electrode and extending toward the other surface zone a region of material having said opposite type conductivity but an active impurity concentration lower than that of and thus a resistivity higher than that of the substrate.

2. A device as set forth in claim 1 wherein said opposite type higher resistivity region surrounds the drain zone on all sides and extends to a greater depth in the body than that of the drain zone.

3. An insulated gate field effect device comprising a semiconductive body including a surface portion of one conductivity type material, at least two spaced zones of the opposite conductivity type in the body constituting source and drain electrodes and forming P-N junctions with the one-type surface portion to contain a channel region, said source and drain having a lower resistivity than that of the one-type surface portion, a dielectric layer on the surface of the body and covering a portion of the body between the zones of opposite conductivity type, a conductive layer on the surface of the dielectric layer, and ohmic connections to the conductive layer and to the two spaced zones for reverse biasing the P-N junction at the drain electrode, wherein the improvement comprises within the body contiguous with the zone constituting the drain electrode and extending toward but spaced from the other constituting the source a further region of material having said opposite type conductivity but an active impurity concentration which is lower than that of and thus a resistivity higher than that of the one-type surface portion to thereby extend the drain P-N junction to the interface between the further region and the one-type surface portion.

4. A device as set forth in claim 3 wherein said opposite type further region completely separates the drain from the source and the one-type surface portion.

* * * * *